United States Patent
Yu et al.

(10) Patent No.: US 12,435,271 B2
(45) Date of Patent: Oct. 7, 2025

(54) QUANTUM DOT LIGHT-EMITTING DEVICE AND MANUFACTURING METHOD THEREFOR, AND DISPLAY PANEL

(71) Applicants: Beijing BOE Technology Development Co., Ltd., Beijing (CN); BOE Technology Group Co., Ltd., Beijing (CN)

(72) Inventors: Gang Yu, Beijing (CN); Tieshi Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 745 days.

(21) Appl. No.: 17/777,405

(22) PCT Filed: Jan. 13, 2021

(86) PCT No.: PCT/CN2021/071556
§ 371 (c)(1),
(2) Date: May 17, 2022

(87) PCT Pub. No.: WO2021/147739
PCT Pub. Date: Jul. 29, 2021

(65) Prior Publication Data
US 2022/0399515 A1    Dec. 15, 2022

(30) Foreign Application Priority Data

Jan. 20, 2020    (CN) .......................... 202010065999.3

(51) Int. Cl.
*C09K 11/54* (2006.01)
*H10K 50/115* (2023.01)
(Continued)

(52) U.S. Cl.
CPC ............ *C09K 11/54* (2013.01); *H10K 50/115* (2023.02); *H10K 50/16* (2023.02); *H10K 85/00* (2023.02); *H10K 71/40* (2023.02)

(58) Field of Classification Search
CPC ....... H10K 50/115; H10K 50/16; H10K 71/40
See application file for complete search history.

(56) References Cited

U.S. PATENT DOCUMENTS

| | | | |
|---|---|---|---|
| 2018/0108841 A1 | 4/2018 | Li et al. | |
| 2018/0219186 A1 | 8/2018 | Huang | |
| (Continued) | | | |

FOREIGN PATENT DOCUMENTS

| | | | |
|---|---|---|---|
| CN | 105514302 A | 4/2016 | |
| CN | 106601925 A | 4/2017 | |
| (Continued) | | | |

OTHER PUBLICATIONS

CN202010065999.3 first office action.
CN202010065999.3 second office action.

*Primary Examiner* — Daniel P Shook
(74) *Attorney, Agent, or Firm* — IPro, PLLC (57) ABSTRACT

A quantum dot light-emitting device and a manufacturing method therefor, and a display panel. The quantum dot light-emitting device comprises: a quantum dot layer and an electron transport layer adjacent to the quantum dot layer; the electron transport layer comprises a first group, and the quantum dot layer comprises a second group; the first group and the second group each comprise a hydrophilic group. The first group and the second group are combined by means of a hydrogen bond on contact surfaces of the quantum dot layer and the electron transport layer, to enhance an interface interaction force between the quantum dot layer and the electron transport layer, thereby reducing interface defects of the quantum dot layer and the electron transport layer, and (Continued)

improving the electroluminescence performance and stability of the quantum dot device.

16 Claims, 5 Drawing Sheets

(51) Int. Cl.
  *H10K 50/16* (2023.01)
  *H10K 71/40* (2023.01)
  *H10K 85/00* (2023.01)

(56) References Cited

U.S. PATENT DOCUMENTS

| | | |
|---|---|---|
| 2018/0358560 A1 | 12/2018 | Huang |
| 2019/0296255 A1 | 9/2019 | Kim et al. |
| 2019/0319208 A1 | 10/2019 | Han et al. |
| 2020/0075877 A1 | 3/2020 | Yu |
| 2020/0332181 A1 | 10/2020 | Zhang |
| 2021/0057663 A1 | 2/2021 | Zhang |
| 2021/0253948 A1* | 8/2021 | Zhang .................. C09K 11/06 |

FOREIGN PATENT DOCUMENTS

| | | |
|---|---|---|
| CN | 106784406 A | 5/2017 |
| CN | 107302059 A | 10/2017 |
| CN | 108550707 A | 9/2018 |
| CN | 109266350 A | 1/2019 |
| CN | 109935724 A | 6/2019 |
| CN | 110010776 A | 7/2019 |
| CN | 110098341 A | 8/2019 |
| CN | 110137387 A | 8/2019 |
| WO | 2017128737 A1 | 8/2017 |
| WO | 2019217199 A1 | 11/2019 |

\* cited by examiner

QUANTUM DOT LIGHT-EMITTING DEVICE AND MANUFACTURING METHOD THEREFOR, AND DISPLAY PANEL

CROSS REFERENCE TO RELATED APPLICATIONS

The disclosure is a National Stage of International Application No. PCT/CN2021/071556, filed on Jan. 13, 2021, which claims the priority of the Chinese patent application No. 202010065999.3 filed to the China Patent Office on Jan. 20, 2020, and entitled "Quantum dot light-emitting device manufacturing method therefor, and display panel", the contents of which are incorporated into the present disclosure by reference in their entireties.

FIELD

The disclosure relates to the technical field of display, in particular to a quantum dot light-emitting device a manufacturing method therefor, and a display panel.

BACKGROUND

Quantum dots are solution-processable semiconductor nanocrystals with the advantages of narrow light-emitting spectrum, adjustable light-emitting wavelength, high spectral purity and the like, and are most expected to become a core part of a next-generation light-emitting device. Quantum dot light emitting diodes (QLEDs) are to use quantum dots as manufacturing materials of a light-emitting layer and introduce the light-emitting layer between different conductive materials to obtain light with a required wavelength. The QLED has the advantages of being wide in color gamut, self-luminous, low in starting voltage, high in response speed, long in service life and the like.

SUMMARY

Some embodiments of the disclosure provide a quantum dot light-emitting device, including:
  an electron transport layer, wherein a material of the electron transport layer includes a host material and a first group connected with the host material, and the first group is a hydrophilic group; and
  a quantum dot layer, wherein the quantum dot layer and the electron transport layer are laminated in film layers and adjacent to each other, the material of the quantum dot layer includes a quantum dot material and a second group connected with the quantum dot material, the second group is a hydrophilic group, and the first group and the second group are bonded by means of a hydrogen bond on a contact surface of the quantum dot layer and the electron transport layer.

Optionally, the second group is generated by illumination decomposition of a third group connected with the quantum dot material, the third group is a lipophilic group, and the third group includes a photosensitive group.

Optionally, the third group includes a long chain carboxylic acid, an amine, thiol, an organic phosphine oxide group, o-diazoquinones, a benzoin derivative, an azobisnitrile derivative, or a group having a disulfide bond.

Optionally, the second group includes at least one of hydroxyl, carboxyl or amino.

Optionally, the material of the quantum dot layer further includes a fourth group connected with the quantum dot material.

Optionally, the fourth group includes at least one of carboxylic acid, amine, thiol or organic phosphine oxide.

Optionally, the host material includes zinc oxide nanoparticles, and the first group includes a short-chain alcohol amine.

Optionally, the first group includes ethanolamine, the second group includes indene 1-formate, and the ethanolamine and the indene 1-formate are bonded by means of a hydrogen bond on contact surfaces of the quantum dot layer and the electron transport layer.

Optionally, the quantum dot light-emitting device further includes a substrate, and a cathode, the electron transport layer, the quantum dot layer, a hole transport layer, a hole injection layer and an anode which are sequentially stacked on the substrate.

In another aspect, some embodiments of the disclosure further provide a manufacturing method for the quantum dot light-emitting device, including:
  forming an electron transport layer and a quantum dot layer which are laminated in film layers and adjacent to each other on a substrate, wherein the material of the electron transport layer includes a host material and a first group connected with the host material, the first group is a hydrophilic group, the material of the quantum dot layer includes a quantum dot material and a third group connected with the quantum dot material, and the third group is a lipophilic group; and
  illuminating the quantum dot layer to decompose the third group into a second group, wherein the second group is a hydrophilic group, and the first group and the second group are bonded by means of a hydrogen bond on a contact surface of the quantum dot layer and the electron transport layer.

Optionally, the forming the quantum dot layer includes:
  providing a quantum dot solution, and providing a first ligand including a third group;
  mixing and uniformly stirring the quantum dot solution and the first ligand to obtain a mixed solution;
  centrifuging the mixed solution, removing supernatant liquid, and adding the mixed solution without the supernatant liquid into a solvent to obtain a quantum dot dispersion solution; and
  depositing the quantum dot dispersion solution on the substrate by adopting a spin coating or printing process, and drying to form the quantum dot layer.

Optionally, while providing the quantum dot solution, and providing the first ligand including the third group, the method further includes:
  providing a second ligand including a fourth group; and
  while mixing and uniformly stirring the quantum dot solution and the first ligand, the method further includes:
  mixing and uniformly stirring the quantum dot solution, the first ligand and the second ligand.

Optionally, a mass percentage of the first ligand in the mixed solution is 1-50%.

Optionally, the illuminating the quantum dot layer to decompose the third group into the second group includes:
  performing ultraviolet irradiation from one side of the electron transport layer to decompose the third group into the second group.

Optionally, before forming an electron transport layer and an quantum dot layer which are laminated in film layers and adjacent to each other on the substrate, the method further includes:
  forming a cathode on the substrate;

the forming the electron transport layer and the quantum dot layer which are laminated in film layers and adjacent to each other on the substrate includes:

forming the electron transport layer on the cathode; and forming the quantum dot layer on the electron transport layer.

Optionally, after illuminating the quantum dot layer to decompose the third group into the second group, the method further includes:

forming a hole transport layer on the quantum dot layer;

forming a hole injection layer on the hole transport layer; and forming an anode on the hole injection layer.

In another aspect, some embodiments of the disclosure further provide a display panel, including the quantum dot light-emitting device provided by the embodiments of the disclosure.

DETAILED DESCRIPTION OF THE EMBODIMENTS

In order to make the objective, technical solutions and advantages of the present disclosure clearer, the present disclosure will be further described below in detail with reference to the accompanying drawings. Obviously, the described embodiments are only part of the embodiments of the present disclosure, but not all the embodiments. Based on the embodiments of the present disclosure, other embodiments obtained by those of ordinary skill in the art without creative work all belong to the scope of protection of the present disclosure.

Shapes and dimensions of components in the accompanying drawings do not reflect a real scale and are only intended to illustrate the present disclosure.

According to related technologies, in a quantum dot light-emitting device film forming process, different solvent systems need to be adopted in order to avoid mutual dissolution of a quantum dot layer and an electron transport layer, a quantum dot material often adopts an oily ligand (such as oleic acid and long-chain thiol), and a material of the electron transport layer adopts a short-chain hydrophilic ligand, so that the quantum dot layer and the electron transport layer correspond to unmatched ligand types, so that in the formed quantum dot light-emitting device, due to the fact that the ligand types of the quantum dot layer and the electron transport layer are different, the interface affinity of the quantum dot layer and the electron transport layer is poor, and a defect state is easily formed between the quantum dot layer and the electron transport layer, which is not conducive to the electroluminescent performance and the stability of the quantum dot light-emitting device. And in the aging process of the quantum dot light-emitting device, a process of removing defects on an interface exists, so that the problem of abnormal brightness aging curve can occur.

Figure 1:
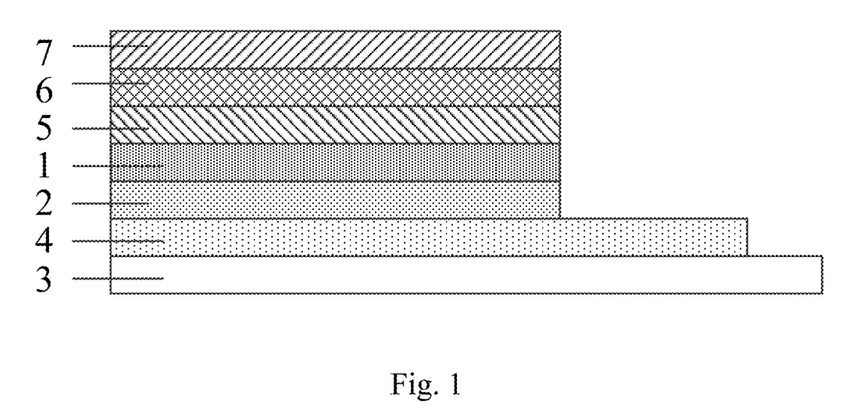
FIG. 1 is a structural schematic diagram of a quantum dot light-emitting device provided by some embodiments of the disclosure.

Based on this, some embodiments of the disclosure provide a quantum dot light-emitting device, as shown in FIG. 1, the quantum dot light-emitting device includes a quantum dot layer 1 and an electron transport layer 2, wherein the quantum dot layer 1 and the electron transport layer 2 are laminated in film layers and adjacent to each other; a material of the electron transport layer 2 includes a host material and a first group connected with the host material, and a material of the quantum dot layer includes a quantum dot material and a second group connected with the quantum dot material; the first group and the second group are hydrophilic groups; and the first group and the second group are bonded by means of a hydrogen bond on contact surfaces of the quantum dot layer 1 and the electron transport layer 2.

In the quantum dot light-emitting device provided by some embodiments of the disclosure, ligands of the quantum dot layer 1 and the electron transport layer 2, namely the first group and the second group, are hydrophilic groups, so that the hydrophilic groups can be bonded by means of the hydrogen bond on the interface of the quantum dot layer 1 and the electron transport layer 2, the bonding force of the interface is enhanced, the interface defects are reduced, and therefore, the electron injection capability can be improved, and the electroluminescent performance and the working stability of the quantum dot light-emitting device are improved.

Optionally, in the quantum dot light-emitting device provided by some embodiments of the disclosure, the second group can be obtained by illumination decomposition of a third group connected with the quantum dot material, and the third group is a lipophilic group.

In some embodiments, when the quantum dot layer is formed by adopting a solution film forming process, a solution includes the lipophilic third group, so that the two film layers cannot be mutually soluble in the process of forming the quantum dot layer and the electron transport layer, then the third group is subjected to illumination decomposition to form the second group, the hydrophilic groups are bonded by means of the hydrogen bond on the interface of the quantum dot layer and the electron transport layer, the interface bonding force between the quantum dot layer and the electron transport layer is increased, and the interface defects are reduced.

In some embodiments, since the third group is decomposed after being illuminated, the third group includes a photosensitive group. The third group may include, for example, a long chain carboxylic acid with 3-20 carbon atoms, an amine, thiol or an organic phosphine oxide group connected with the quantum dot material, and may also include o-diazoquinones, a benzoin derivative, an azobisnitrile derivative or a group having a disulfide bond.

Optionally, in the quantum dot light-emitting device provided by some embodiments of the disclosure, the second group may include one or a combination of the following groups: hydroxyl, carboxyl and amino.

Optionally, in the quantum dot light-emitting device provided by some embodiments of the disclosure, the quantum dot layer can further include a fourth group connected with the quantum dot material, that is, a ligand of the quantum dot material can simultaneously include the second group and the fourth group, and the fourth group has smaller steric hindrance and can fill gaps among the second group, the surfaces of the quantum dots are further passivated, and the quantum yield is improved.

Optionally, in the quantum dot light-emitting device provided by some embodiments of the disclosure, the fourth group can include one or a combination of the following groups: carboxylic acid, amine, thiol and organic phosphine oxide.

In the quantum dot light-emitting device provided by some embodiments of the disclosure, the quantum dot material can, for example, be cadmium selenide/cadmium sulfide (CdSe/CdS) core-shell quantum dots, cadmium sulfide (CdS), cadmium selenide (CdSe), cadmium antimonide (CdTe), zinc selenide (ZnSe), indium phosphide (InP), lead sulfide (PbS), copper indium sulfide ($CuInS_2$), zinc oxide (ZnO), cesium lead chloride ($CsPbCl_3$), cesium lead bromide ($CsPbBr_3$), cesium lead iodide ($CsPbI_3$), cadmium sulfide/zinc sulfide (CdS/ZnS) core-shell quantum dots, cadmium selenide/zinc sulfide (CdSe/ZnS) core-shell quantum dots, zinc selenide (ZnSe), indium phosphide/zinc sulfide (InP/ZnS) core-shell quantum dots, lead sulfide/zinc sulfide (PbS/ZnS) core-shell quantum dots, indium arsenide (InAs), indium gallium arsenide (InGaAs), indium gallium nitride (InGaN), gallium nitride (GaN), zinc telluride (ZnTe), silicon (Si), germanium (Ge), carbon (C) and the like.

Optionally, in the quantum dot light-emitting device provided by some embodiments of the disclosure, the host material of the electron transport layer can, for example, be zinc oxide (ZnO) nanoparticles. Optionally, the first group may include a short-chain alcohol amine. The short-chain alcohol amine can be ethanolamine, propanolamine or the like.

Optionally, in the quantum dot light-emitting device provided by some embodiments of the disclosure, the first group can include ethanolamine, the second group can include indene 1-formate, and the ethanolamine and the indene 1-formate can be bonded by means of a hydrogen bond on contact surfaces of the quantum dot layer and the electron transport layer.

Optionally, in the quantum dot light-emitting device provided by some embodiments of the disclosure, as shown in FIG. 1, the quantum dot light-emitting device further includes a substrate 3 located on the side, deviating from the quantum dot layer 1, of the electron transport layer 2, a cathode 4 located between the substrate 3 and the electron transport layer 2, a hole transport layer 5 located on the side, deviating from the electron transport layer 2, of the quantum dot layer 1, a hole injection layer 6 located on the side, deviating from the quantum dot layer 1, of the hole transport layer 5; and an anode 7 located on the side, deviating from the hole transport layer 5, of the hole injection layer 6.

Optionally, in the quantum dot light-emitting device provided by some embodiments of the disclosure, the substrate can, for example, be a glass substrate, the material of the cathode can, for example, be indium tin oxide (ITO), other metals or a conductive semiconductor material, the material of the hole transport layer can be 4,4'-N,N'-dicarbazolylbiphenyl (CBP), the material of the hole injection layer can be 2,3,6,7,10,11-hexacyano-1,4,5,8,9,12-hexaazatriphenylene (HAT-CN), and the material of the anode can, for example, be silver (Ag).

Figure 2:
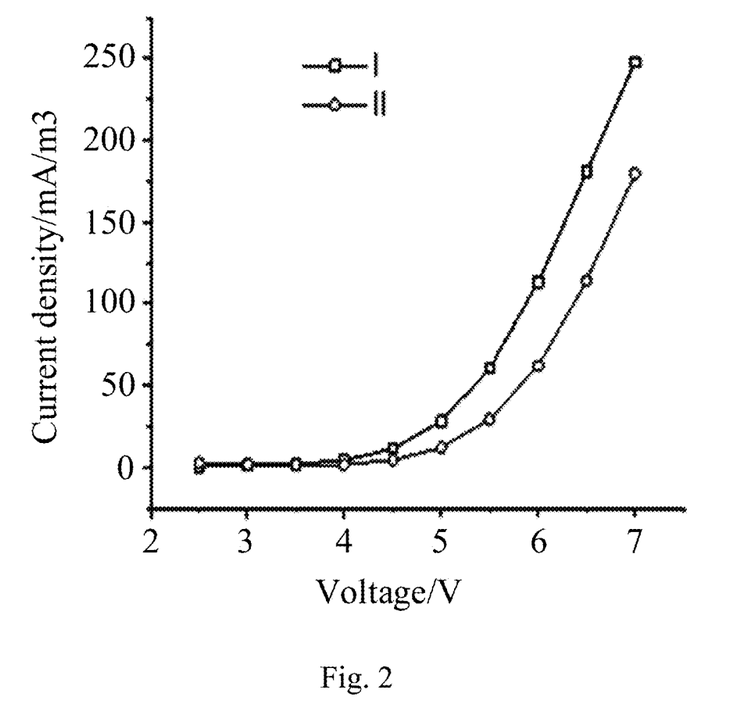
FIG. 2 is a current density/voltage curve graph of a quantum dot light-emitting device I and a quantum dot light-emitting device II.
Figure 3:
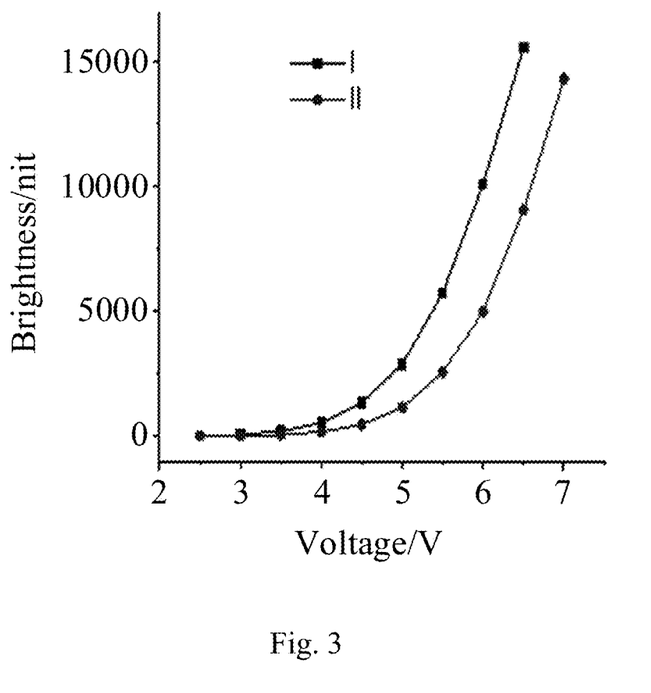
FIG. 3 is a brightness/voltage curve graph of the quantum dot light-emitting device I and the quantum dot light-emitting device II.

The performance of the quantum dot light-emitting device provided by embodiments of the disclosure will be illustrated below. Wherein a quantum dot light-emitting device I is the quantum dot light-emitting device provided by embodiments of the disclosure, and a quantum dot light-emitting device II is a quantum dot light-emitting device provided by a related technology. In quantum dot light-emitting device II, a quantum dot layer includes lipophilic groups and does not include hydrophilic groups, an electron transport layer includes hydrophilic groups, and the lipophilic groups and the hydrophilic groups cannot be bonded through hydrogen bonds on the interface of the electron transport layer and the quantum dot layer. A current density/voltage (J/V) curve of the quantum dot light-emitting device I and the quantum dot light-emitting device II is shown in FIG. 2, and the current density of the quantum dot light-emitting device I is larger than that of the quantum dot light-emitting device II. A brightness/voltage (L/V) curve of the quantum dot light-emitting device I and the quantum dot light-emitting device II is shown in FIG. 3, the brightness of the quantum dot light-emitting device I is larger than that of the quantum dot light-emitting device II under the same voltage, and the performance of the quantum dot light-emitting device I is better than that of the quantum dot light-emitting device II.

Figure 4:
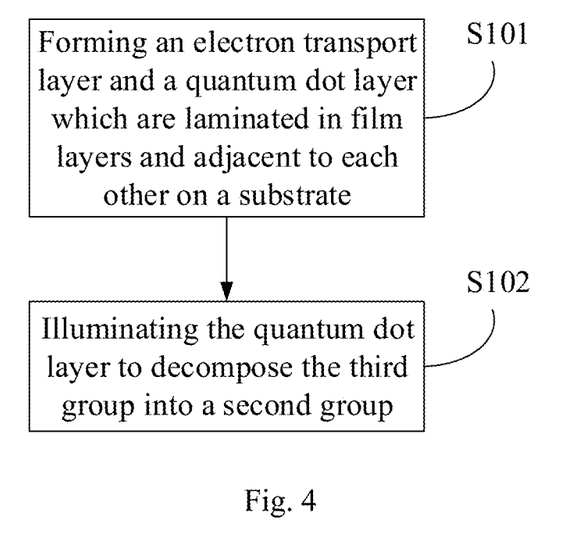
FIG. 4 is a schematic flow diagram of a manufacturing method for a quantum dot light-emitting device provided by some embodiments of the disclosure.

Based on the same inventive concept, some embodiments of the disclosure further provide a manufacturing method for the quantum dot light-emitting device, as shown in FIG. 4, including the following steps:

S101, forming an electron transport layer and a quantum dot layer which are laminated in film layers and adjacent to each other on a substrate, wherein a material of the electron transport layer includes a host material and a first group connected with the host material, the first group is a hydrophilic group, a material of the quantum dot layer includes a quantum dot material and a third group connected with the quantum dot material, and the third group is a lipophilic group; and S102, illuminating the quantum dot layer to decompose the third group into a second group, wherein the second group is a hydrophilic group, and the first group and second group are bonded by means of a hydrogen bond on contact surfaces of the quantum dot layer and the electron transport layer.

According to the manufacturing method for the quantum dot light-emitting device provided by embodiments of the disclosure, the electron transport layer formed on the substrate includes the hydrophilic first group, and the formed quantum dot layer includes the lipophilic third group, so that mutual dissolution of the electron transport layer and the quantum dot layer in the film forming process of the electron transport layer and the quantum dot layer can be avoided; after the electron transport layer and the quantum dot layer are formed, the quantum dot layer is illuminated, so that the lipophilic third group is decomposed into the hydrophilic second group, the quantum dot layer and the electron transport layer each include a hydrophilic group, and the hydrophilic groups can be bonded by means of a hydrogen bond on the interface of the quantum dot layer and the electron transport layer. Therefore, interface defects of the quantum dot layer and the electron transport layer can be reduced, and the electroluminescent performance and stability of the quantum dot light-emitting device are improved.

Optionally, in the step S101 of the manufacturing method provided by embodiments of the disclosure, the forming the quantum dot layer including the third group may specifically include:

provide a quantum dot solution, and providing a first ligand including a third group;

mixing and uniformly stirring the quantum dot solution and the first ligand to obtain a mixed solution;

centrifuging the mixed solution, removing supernatant liquid, and adding the part with the supernatant liquid removed into a solvent to obtain a quantum dot dispersion solution; and depositing the quantum dot dispersion solution on the substrate by adopting a spin coating or printing process, and drying to form the quantum dot layer.

In some embodiments, the provided quantum dot solution can, for example, be a quantum dot solution with other ligands, that is, ligands of quantum dots in the initial quantum dot solution are replaced with the first ligand through a ligand replacement method.

Optionally, in the manufacturing method provided by embodiments of the disclosure, the forming the electron transport layer including the first group on the substrate includes:

forming the electron transport layer including zinc oxide nanoparticles coordinated with the first group on the substrate, wherein the first group includes ethanolamine;

the providing the first ligand including the third group includes:

providing the first ligand including 1,2-naphthoquinone-2-diazido-6-propanethiol;

the forming the quantum dot layer includes:

forming the quantum dot layer including quantum dots coordinated with the third group; and the illuminating the quantum dot layer to decompose the third group into the second group includes:

illuminating the quantum dot layer to decompose 1,2-naphthoquinone-2-diazido-6-propanethiol into indene 1-formate and nitrogen; wherein ethanolamine and indene 1-formate are bonded by means of a hydrogen bond on contact surfaces of the quantum dot layer and the electron transport layer.

Optionally, in the manufacturing method provided by embodiments of the disclosure, while providing the quantum dot solution, and providing the first ligand including the third group, the method may further include:

providing a second ligand including a fourth group; and while mixing and uniformly stirring the quantum dot solution and the first ligand, the method may further include:

mixing and uniformly stirring the quantum dot solution, the first ligand and the second ligand.

In some embodiments, ligands of the initial quantum dot solution are replaced with the first ligand and the second ligand through a ligand replacement method. In the manufacturing method provided by embodiments of the disclosure, in the manufacture process of the quantum dot layer, the second ligand is also added, so that the second ligand can fill gaps among indene 1-formate, the surfaces of the quantum dots are further passivated, and the quantum yield is improved.

In some embodiments, the first ligand includes, for example, a long chain carboxylic acid with 3-20 carbon atoms, an amine or a thiol group capable of being coordinated with quantum dots, and may also include o-diazoquinones, a benzoin derivative, an azobisnitrile derivative or a compound with a disulfide bond. The second ligand may, for example, include one or a combination of the following groups: a long chain carboxylic acid with 3-20 carbon atoms, an amine and thiol.

Optionally, in manufacturing method provided by embodiments of the disclosure, a mass percentage of the first ligand in the mixed solution is 1-50%, so that the film forming effect of the quantum dot layer can be ensured.

Figure 5:
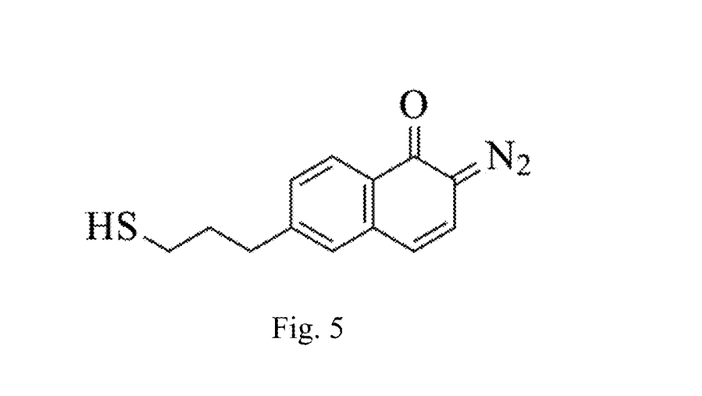
FIG. 5 is a schematic diagram of a first ligand provided by some embodiments of the disclosure.
Figure 6:
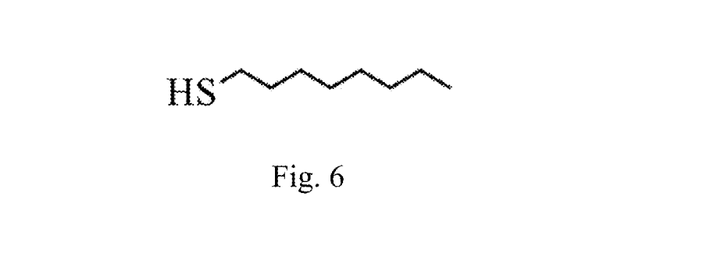
FIG. 6 is a schematic diagram of a second ligand provided by some embodiments of the disclosure.

In some embodiments, by taking the condition of providing the first ligand and the second ligand as an example, as shown in FIG. 5, the first ligand may, for example, be 1,2-naphthoquinone-2-diazido-6-propanethiol. As shown in FIG. 6, the second ligand may, for example, be n-hexanethiol.

Figure 7:
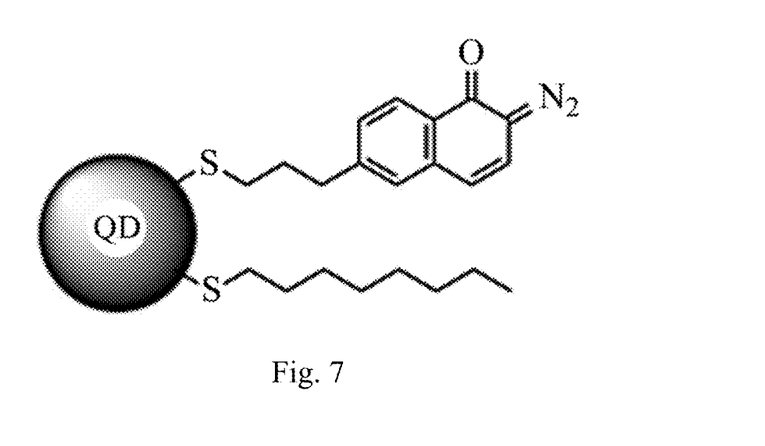
FIG. 7 is a schematic diagram of quantum dots coordinated with the first ligand and the second ligand provided by some embodiments of the disclosure.
Figure 8:
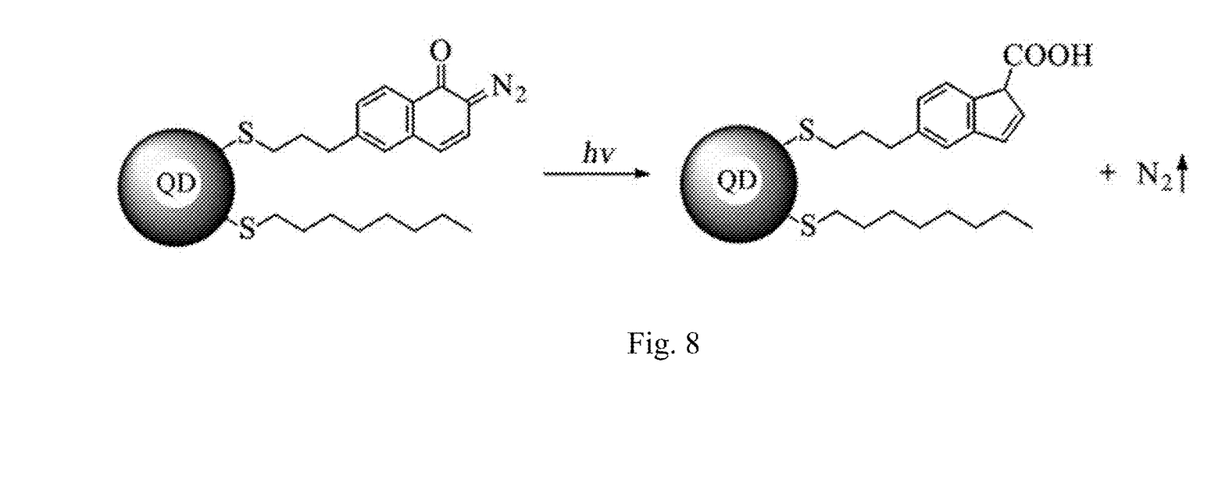
FIG. 8 is a reaction schematic diagram of quantum dots under the ultraviolet radiation condition provided by some embodiments of the disclosure.
Figure 9:
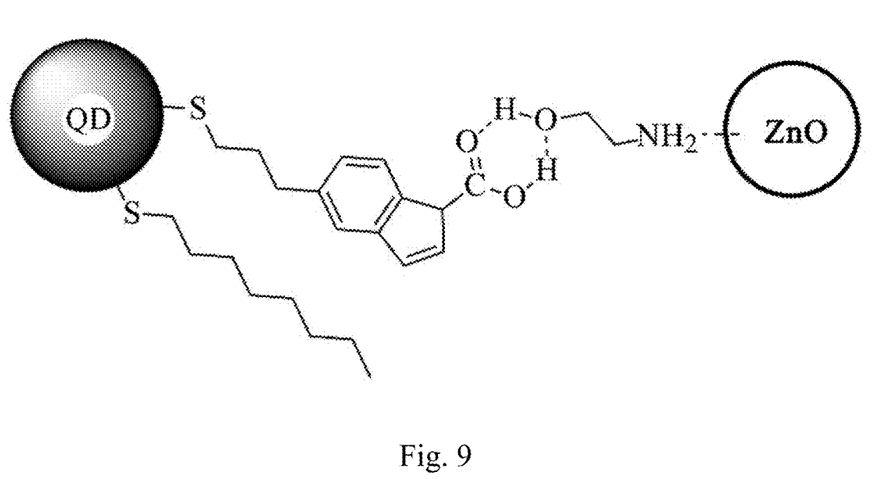
FIG. 9 is a schematic diagram of bonding of hydrophilic ligands on an interface of a quantum dot layer and an electron transport layer by means of a hydrogen bond.

In some embodiments, the providing the quantum dot solution may, for example, include dissolving CdSe/CdS core-shell quantum dots of an oleic acid-oleylamine ligand in anhydrous oxygen-free n-hexane. The providing the first ligand and the providing the second ligand may, for example, include providing an anhydrous oxygen-free n-hexane solution of 1,2-naphthoquinone-2-diazido-6-propanethiol and n-hexanethiol. The mixing and uniformly stirring the quantum dot solution, the first ligand and the second ligand may, for example, be performed by stirring in a water-free and oxygen-free room temperature environment. The adding the part with the supernatant liquid removed into the solvent to obtain the quantum dot dispersion solution may, for example, include adding the part with the supernatant liquid removed into n-hexane for re-dissolving to obtain the quantum dot dispersion solution. For example, a quantum dot material obtained after CdSe/CdS core-shell quantum dots of an oleic acid-oleylamine ligand is subjected to ligand replacement by using ligands as shown in FIG. 5 and FIG. 6 is as shown in FIG. 7. A reaction formula of quantum dots under the ultraviolet irradiation condition is as shown in FIG. 8, and a lipophilic group is decomposed into a hydrophilic group indene 1-formate and nitrogen ($N_2$) under the ultraviolet (UV) irradiation. By taking the electron transport layer including zinc oxide nanoparticles connected with ethanolamine as an example, a schematic diagram of bonding of a quantum dot material including a hydrophilic ligand and the zinc oxide nanoparticles by means of a hydrogen bond on an interface of an electron transport layer and a quantum dot layer is shown in FIG. 9.

Optionally, the S102 of illuminating the quantum dot layer to decompose the third group into the second group in the manufacturing method provided by the embodiments of the disclosure includes:

performing ultraviolet irradiation from one side of the electron transport layer to decompose the third group into the second group.

According to the manufacturing method provided by embodiments of the disclosure, ultraviolet irradiation is carried out on one side, deviating from the quantum dot layer, of the electron transport layer, and the electron transport layer does not absorb a large amount of ultraviolet, so that the situation that the ultraviolet is absorbed by the quantum dot layer and cannot reach the interface of the quantum dot layer and the electron transport layer due to direct irradiation of the quantum dot layer can be avoided while irradiating with a small dose of ultraviolet, and it is ensured that the interface of the quantum dot layer and the electron transport layer is fully irradiated by the ultraviolet so that the lipophilic third group can be decomposed into the hydrophilic second group. The interface defects of the quantum dot layer and the electron transport layer are reduced. Moreover, when the ultraviolet irradiates the quantum dot layer, the ultraviolet can induce the surface defect states of the quantum dots to be filled and eliminated, so that the photoluminescence quantum yield (PLQY) of the quantum dots can be improved.

Optionally, in the manufacturing method provided by embodiments of the disclosure, before forming an electron transport layer and a quantum dot layer which are laminated in film layers and adjacent to each other on a substrate, the method may further include:

forming a cathode on a substrate;
the forming the electron transport layer and the quantum dot layer which are laminated in film layers and adjacent to each other on the substrate includes:
forming an electron transport layer on the cathode; and
forming the quantum dot layer on the electron transport layer.

In some embodiments, after the quantum dot layer is formed on the electron transport layer, ultraviolet irradiation is carried out on the quantum dot layer from one side, deviating from the quantum dot layer, of the substrate, so that lipophilic groups are decomposed into hydrophilic groups. The substrate may be, for example, a glass substrate.

Optionally, in the manufacturing method provided by embodiments of the disclosure, after illuminating the quantum dot layer to decompose the third group into the second group in the step S102, the method may further include:

forming a hole transport layer on the quantum dot layer;
forming a hole injection layer on the hole transport layer; and
forming an anode on the hole injection layer.

In some embodiments, the anode can be firstly formed on the substrate, the hole injection layer, the hole transport layer, the quantum dot layer and the electron transport layer are sequentially formed on the anode, then illumination is carried out from the side, away from the quantum dot layer, of the electron transport layer, and then the cathode is formed on the electron transport layer.

The manufacturing method of the quantum dot light-emitting device provided by embodiments of the disclosure is illustrated below by taking 1,2-naphthoquinone-2-diazido-6-propanethiol as the first ligand, n-hexanethiol as the second ligand, CdSe/CdS core-shell quantum dots as quantum dots, and the electron transport layer including zinc oxide nanoparticles as an example. In some embodiments, the manufacturing method of the quantum dot light-emitting device includes the following steps:

S201, forming a cathode on a substrate;
wherein a material of the cathode can be indium tin oxide (ITO), and can also be other metal materials or semiconductor materials;
S202, providing a ZnO nanoparticle solution, depositing the ZnO nanoparticle solution on the cathode through a spin coating or printing process, and removing a solvent to uniformly form a film so as to form an electron transport layer;
wherein in the ZnO nanoparticle solution, a ligand of ZnO nanoparticles can be a short-chain alcohol amine, such as ethanolamine, propanolamine and the like, and the ligand can be added in the preparation process of the ZnO nanoparticles;
S203, dissolving 200 mg of CdSe/CdS core-shell quantum dots of an oleic acid-oleylamine ligand into 10 mL of anhydrous oxygen-free n-hexane, so as to obtain a quantum dot solution of the oleic acid-oleylamine ligand;
wherein the CdSe/CdS core-shell quantum dots can be synthesized by adopting a thermal injection method;
S204, adding 10 mL of an anhydrous oxygen-free n-hexane solution containing 200 mg of n-hexanethiol and 100 mg of 1,2-naphthoquinone-2-diazido-6-propanethiol into the quantum dot solution of the oleic acid-oleylamine ligand, stirring for 1 h in an anhydrous oxygen-free room temperature environment, centrifuging the resulting reaction solution, removing the obtained supernate, and re-dissolving with n-hexane to obtain a quantum dot (QD) dispersion solution including a third group and a fourth group;
S205, depositing the quantum dot dispersion solution including the third group and the fourth group on the electron transport layer through a spin coating or printing process, and drying to remove a solvent to form a quantum dot layer;
for example, the quantum dot dispersion solution can be spin-coated at a rotating speed of 2500 rpm;
S206, performing ultraviolet radiation on the quantum dot layer from one side, deviating from the quantum dot layer, of the substrate;
for example, the structure on which the quantum dot layer and the electron transport layer are formed is placed on a UV lamp in a glove box environment, and irradiated by using ultraviolet rays with a wavelength of 365 nm from one side of the substrate, wherein an irradiation dose can, for example, be 10 mJ/cm$^2$;
S207, forming a hole transport layer on the quantum dot layer;
wherein the structure subjected to ultraviolet radiation is placed in a vacuum cavity, and CBP is evaporated;
S208, forming a hole injection layer on the hole transport layer;
for example, HTA-CN is evaporated on the CBP film layer to serve as the hole injection layer; and
S209, forming an anode on the hole injection layer;
for example, Ag is evaporated on the HTA-CN film layer to serve as the anode.

Based on the same inventive concept, some embodiments of the disclosure further provide a display panel, including the quantum dot light-emitting device provided by embodiments of the disclosure.

In conclusion, according to the quantum dot light-emitting device and the manufacturing method therefor, and the display panel provided by the embodiments of the disclosure, the electron transport layer formed on the substrate includes the hydrophilic first group, and the formed quantum dot layer includes the lipophilic third group, so that mutual dissolution of the electron transport layer and the quantum dot layer in the film forming process of the electron transport layer and the quantum dot layer can be avoided; after the electron transport layer and the quantum dot layer are formed, the quantum dot layer is illuminated, so that the lipophilic third group is decomposed into the hydrophilic second group, the quantum dot layer and the electron transport layer each include a hydrophilic group, and the hydrophilic groups can be bonded by means of the hydrogen bond on the interface of the quantum dot layer and the electron transport layer. Therefore, interface defects of the quantum dot layer and the electron transport layer can be reduced, and the electroluminescent performance and stability of the quantum dot light-emitting device are improved.

Obviously, those of skill in the art can make various changes and modifications to the present disclosure without departing from the spirit and scope of the present disclosure. Thus, if these changes and modifications of the present disclosure fall within the scope of the claims of the present disclosure and their equivalents, the present disclosure is also intended to include these changes and modifications.

What is claimed is:

1. A quantum dot light-emitting device, comprising:
an electron transport layer, wherein a material of the electron transport layer comprises a host material and a first group connected with the host material, and the first group is a hydrophilic group; and
a quantum dot layer, wherein the quantum dot layer and the electron transport layer are laminated in film layers and adjacent to each other, a material of the quantum dot layer comprises a quantum dot material and a second group connected with the quantum dot material, the second group is a hydrophilic group, and the first group and the second group are bonded by means of a hydrogen bond on a contact surface of the quantum dot layer and the electron transport layer;
wherein the host material comprises zinc oxide nanoparticles, and the first group comprises a short-chain alcohol amine.

2. The quantum dot light-emitting device according to claim 1, wherein the second group is generated by illumination decomposition of a third group connected with the quantum dot material, the third group is a lipophilic group, and the third group comprises a photosensitive group.

3. The quantum dot light-emitting device according to claim 2, wherein the third group comprises at least one of a long chain carboxylic acid, an amine, thiol, an organic phosphine oxide group, o-diazoquinones, a benzoin derivative, an azobisnitrile derivative or a group with a disulfide bond.

4. The quantum dot light-emitting device according to claim 1, wherein the second group comprises at least one of hydroxyl, carboxyl or amino.

5. The quantum dot light-emitting device according to claim 1, wherein the material of the quantum dot layer further comprises a fourth group connected with the quantum dot material.

6. The quantum dot light-emitting device according to claim 5, wherein the fourth group comprises at least one of carboxylic acid, amine, thiol or organic phosphine oxide.

7. The quantum dot light-emitting device according to claim 1, wherein the first group comprises ethanolamine, the second group comprises indene 1-formate, and the ethanolamine and the indene 1-formate are bonded by means of a hydrogen bond on the contact surface of the quantum dot layer and the electron transport layer.

8. The quantum dot light-emitting device according to claim 1, further comprising a substrate, and a cathode, the electron transport layer, the quantum dot layer, a hole transport layer, a hole injection layer and an anode which are sequentially stacked on the substrate.

9. A display panel, comprising the quantum dot light-emitting device according to claim 1.

10. A manufacturing method for a quantum dot light-emitting device, comprising:
forming an electron transport layer and a quantum dot layer which are laminated in film layers and adjacent to each other on a substrate, wherein a material of the electron transport layer comprises a host material and a first group connected with the host material, the first group is a hydrophilic group, a material of the quantum dot layer comprises a quantum dot material and a third group connected with the quantum dot material, and the third group is a lipophilic group; and
illuminating the quantum dot layer to decompose the third group into a second group, wherein the second group is a hydrophilic group, and the first group and the second group are bonded by means of a hydrogen bond on a contact surface of the quantum dot layer and the electron transport layer.

11. The method according to claim 10, wherein the forming the quantum dot layer comprises:
providing a quantum dot solution, and providing a first ligand comprising the third group;
mixing and uniformly stirring the quantum dot solution and the first ligand to obtain a mixed solution;
centrifuging the mixed solution, removing supernatant liquid, and adding the mixed solution without the supernatant liquid into a solvent to obtain a quantum dot dispersion solution; and
depositing the quantum dot dispersion solution on the substrate by adopting a spin coating or printing process, and drying to form the quantum dot layer.

12. The method according to claim 11, wherein while providing the quantum dot solution, and providing the first ligand comprising the third group, the method further comprises:
providing a second ligand comprising a fourth group; and
while mixing and uniformly stirring the quantum dot solution and the first ligand, the method further comprises:
mixing and uniformly stirring the quantum dot solution, the first ligand and the second ligand.

13. The method according to claim 11, wherein a mass percentage of the first ligand in the mixed solution is 1-50%.

14. The method according to claim 10, wherein the illuminating the quantum dot layer to decompose the third group into the second group comprises:
performing ultraviolet irradiation from one side of the electron transport layer to decompose the third group into the second group.

15. The method according to claim 10, wherein before forming an electron transport layer and a quantum dot layer which are laminated in film layers and adjacent to each other on the substrate, the method further comprises:
forming a cathode on the substrate;
the forming the electron transport layer and the quantum dot layer which are laminated in film layers and adjacent to each other on the substrate comprises:
forming the electron transport layer on the cathode; and
forming the quantum dot layer on the electron transport layer.

16. The method according to claim 10, wherein after illuminating the quantum dot layer to decompose the third group into the second group, the method further comprises:
forming a hole transport layer on the quantum dot layer;
forming a hole injection layer on the hole transport layer; and
forming an anode on the hole injection layer.

* * * * *